United States Patent [19]
Ando

[11] Patent Number: 5,705,825
[45] Date of Patent: Jan. 6, 1998

[54] RESONANT TUNNELING BIPOLAR TRANSISTOR

[75] Inventor: Yuji Ando, Tokyo, Japan

[73] Assignee: NEC Corporation, Tokyo, Japan

[21] Appl. No.: 520,777

[22] Filed: Aug. 30, 1995

[30] Foreign Application Priority Data

Aug. 30, 1994 [JP] Japan .................................. 6-205234

[51] Int. Cl.$^6$ ........................ H01L 29/15; H01L 29/737
[52] U.S. Cl. ............................ 257/25; 257/197; 257/198
[58] Field of Search ............................ 257/25, 198, 197

[56] References Cited

U.S. PATENT DOCUMENTS 5,428,224   6/1995   Hayashi et al. ........................ 257/25

FOREIGN PATENT DOCUMENTS 4125966   4/1992   Japan ........................ 257/25
5-136161  6/1993   Japan .

OTHER PUBLICATIONS

F. Capasso et al., "Quantum-Well Resonant Tunneling Bipolar Transistor Operating at Room Temperature", *IEEE Electron Device Letters*, vol. EDL-7, No. 10, Oct. 1986, pp. 573-576.

*Primary Examiner*—Jerome Jackson, Jr.
*Attorney, Agent, or Firm*—Young & Thompson

[57] ABSTRACT

Excellent negative resistance characteristics are attained in a resonant bipolar transistor (RBT) while improving current gain. A first conduction type collector layers and the opposite conduction type base layer are sequentially formed on a semiconductor substrate. A quantum well structure in which a quantum level of electrons or holes is generated, and a contact layer of the same conduction type as the base layer are sequentially formed on a part of the base layer. An emitter layer of the same conduction type as the collector layer is formed directly on another part of the base. Since good negative resistance characteristics can be attained by utilizing the resonant tunneling effect of base majority carriers, and the quantum well structure causing carrier accumulation can be eliminated from the path of carriers flowing between the emitter and the collector, it is possible to reduce the recombination current at the emitter-base interface and in the quantum well structure, thereby improving current gain.

16 Claims, 3 Drawing Sheets

RESONANT TUNNELING BIPOLAR TRANSISTOR

BACKGROUND OF THE INVENTION

1. Field of the Invention

The present invention relates to a resonant tunneling bipolar transistor (RBT) having negative resistance characteristics and applied to a digital logic circuit or a microwave oscillator.

2. Description of the Related Art

FIG. 5 shows the structure of an RBT according to the prior art. Such RBT is reported in, for example, "IEEE Electron Device Lett.," Vol. EDL-7, p.573, 1986, by F. Capasso, et al. A similar device is also described in Japanese Published Unexamined Patent Application No. 5-136161.

Referring to FIG. 5, there is shown an n-type GaAs substrate 50, on which an n-type GaAs layer 52 constituting a collector layer, base layers 53, 54, and 55, namely a p-type GaAs layer 53, a quantum well structure 54, and a p-type AlGaAs layer 55, an n-type AlGaAs layer 56 constituting an emitter layer, and an n-type GaAs layer 57 constituting an emitter-contact layer are formed. The quantum well structure 54 is a laminated structure consisting of an undoped GaAs spacer layer 54c, an undoped AlAs quantum barrier layer 54b, an undoped GaAs quantum well layer 54a, further undoped AlAs quantum barrier layer 54b, and an undoped AlGaAs spacer layer 54d. An emitter electrode 58E is evaporated on the n-type GaAs emitter contact layer 57, while a collector electrode 58C is evaporated on the bottom side of the n-type GaAs substrate 50. Formed on a surface of the p-type AlGaAs layer 55 which is exposed by etching out a part of the epitaxial layers are a base electrode 59 deposited by evaporation and an accompanying alloy region 59A reaching into the p-type GaAs layer 53.

FIG. 6 shows an energy band profile and current paths between the emitter layer 56 and the collector layer 52 of such an RBT as explained above. In the figure, $E_{el}$ and $E_{hl}$ indicate ground levels of an electron and a heavy hole in the quantum well structure 54, respectively. $I_E$ represents emitter current, $I_C$ collector current, $I_{Bh}$ reverse injection current, $I_{Brs}$ surface recombination current and $I_{Brw}$ quantum well recombination current. In such an RBT, when the bottom of the conduction band of the emitter layer 56 matches the electron ground level of the quantum well structure 54, electrons are injected from the emitter layer 56 into the quantum well structure 54 under the resonant tunneling effect. The injected electrons pass through a depletion layer formed by the collector layer 52 as hot electrons at a high speed, and reach the collector electrode 58C.

Base current ($I_B$) in the RBT consists of the reverse injection hole current ($I_{Bh}$), the interface recombination current ($I_{Brs}$), the quantum well recombination current ($I_{Brw}$), and the bulk recombination current ($I_{Brb}$, not shown in figure). Thus, the common-emitter current gain β is expressed by the following equation:

$$\beta = I_C/(I_{Bh} + I_{Brs} + I_{Brw} + I_{Brb}) \quad (1)$$

In the RBT of the prior art, of the electrons injected into the base layer, those having energy matching the ground level $E_{el}$ are accumulated in the quantum well layer 54a after resonantly passing through the quantum barrier layer 54b so that the quantum well recombination current $I_{Brw}$ is increased. In addition, electrons having injection energy which does not satisfy the resonance condition are reflected by the quantum barrier layer 54b, and accumulate near the emitter-base interface thereby also increasing the interface recombination current $I_{Brs}$. Consequently, a problem with the conventional RBT is that the current gain β decreases according to equation (1).

Because this conventional RBT attains negative resistance characteristics by utilizing the resonant tunneling effect of the majority carriers in the emitter layer (electron in an NPN transistor, and hole in a PNP transistor), it requires a structure such as the quantum well and quantum barrier described above to accumulate carriers flowing through the emitter-collector current path. Such structures, however, increase the base recombination current and degrade the current gain, as we saw above.

OBJECT OF THE INVENTION

The object of the present invention is to provide an RBT which eliminates a quantum well structure that causes accumulation of carriers from the path of carriers between the emitter and the collector, and which reduces the recombination current at the emitter-base interface and in the quantum well so as to improve β while still attaining favorable negative resistance characteristics.

SUMMARY OF THE INVENTION

The present invention provides a resonant tunneling bipolar transistor comprising a semiconductor substrate, an n-type collector layer and a p-type base layer sequentially formed on the semiconductor substrate in the said order, a quantum well structure in which a quantum level of holes is generated and a p-type contact layer formed in sequence on a part of the p-type base layer, an n-type emitter layer formed on another part of the p-type base layer, and a collector electrode, a base electrode, and an emitter electrode which form ohmic contacts with the n-type collector layer, the p-type contact layer, and the n-type emitter layer, respectively.

The present invention also provides a resonant tunneling bipolar transistor comprising a semiconductor substrate, a p-type collector layer and an n-type base layer sequentially formed on the semiconductor substrate in the said order, a quantum well structure in which the quantum level of electrons is generated and an n-type contact layer sequentially formed on a part of the n-type base layer, a p-type emitter layer formed on another part of the n-type base layer, and a collector electrode, a base electrode, and an emitter electrode which form ohmic contacts with the p-type collector layer, the n-type contact layer, and the p-type emitter layer, respectively.

As explained earlier, the conventional RBT attained negative resistance characteristics by utilizing the resonant tunneling effect of the majority carriers in the emitter layer (electron in an NPN transistor, and hole in a PNP transistor). It, therefore, required a quantum well structure in the emitter-collector current path resulting in increased base recombination current. To overcome this problem, the present invention utilizes the resonant tunneling effect of the base majority carriers (hole in the NPN transistor, and electron in the PNP transistor). That is, the quantum well structure is selectively provided only under the base electrode and on the base layer. In such a case, because there exists no quantum well structure on the emitter-collector current path, no carrier accumulation layer is formed, and high emitter injection efficiency can be obtained thereby increasing β.

It is well known that β is estimated as follows if the recombination current in the emitter-base interface and the quantum well can be ignored.

When reverse injection current is dominant in base current:

$$\beta = N_E v_{eB}/(P_B v_{hE}) \cdot \exp(E_g/kT) \quad (2)$$

When bulk recombination current is dominant in base current:

$$\beta = 2L_B^2/W_B^2 \quad (3)$$

where $N_E$ and $P_B$ are the impurity concentrations in the emitter and base layers, respectively, $v_{eB}$ and $v_{hE}$ are the drift velocities of minority carriers in the base and emitter layers, respectively, $E_g$ is the band gap difference of the emitter and base layers, k is the Boltzmann constant, T is the lattice temperature, $L_B$ is the diffusion length of minority carriers in the base layer, and $W_B$ is the base layer thickness. From these formulations, it is seen that β is a constant independent of the current value. While the present invention exhibits negative resistance characteristics in the base current due to the resonant tunneling effect, because β is substantially constant and the collector current is directly proportional to the base current, the collector current also exhibits similar satisfactory negative resistance characteristics.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

(First Embodiment)

Figure 1:
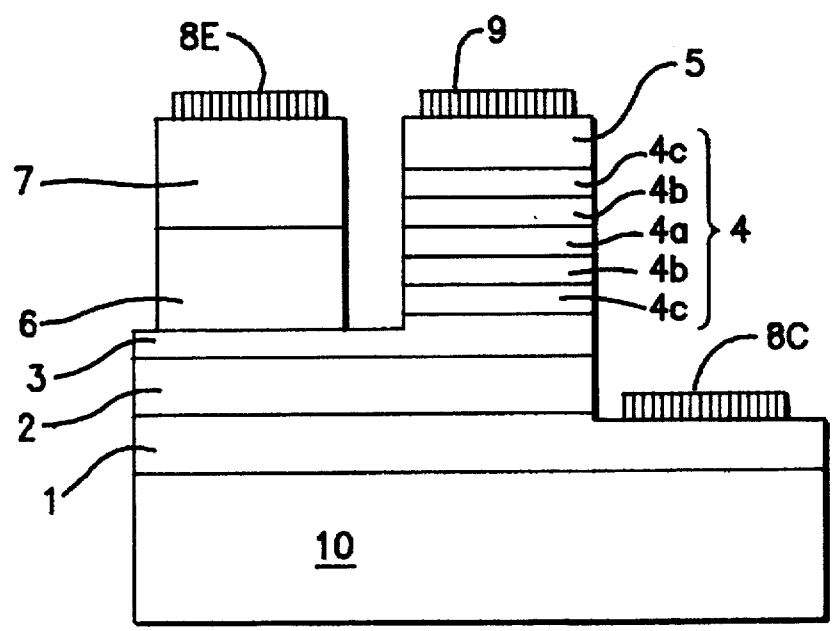
FIG. 1 is a schematic drawing showing the structure of the RBT according to a first embodiment of the present invention.

FIG. 1 shows the structure of an RBT according to the first embodiment of the present invention. In the figure, there are shown a semi-insulating (hereinafter abbreviated as "S.I.") GaAs substrate 10, an n-type GaAs layer 1 constituting a sub-collector layer, an n-type GaAs layer 2 constituting a collector layer, a p-type GaAs layer 3 constituting a base layer, a quantum well structure 4, a p-type GaAs layer 5 constituting a base contact layer, an n-type AlGaAs layer 6 constituting an emitter layer, and an n-type GaAs layer 7 constituting an emitter contact layer. In addition, the quantum well structure 4 is composed of a laminated structure consisting of an undoped GaAs spacer layer 4c, an undoped AlAs quantum barrier layer 4b, an undoped GaAs quantum well layer 4a, an undoped AlAs quantum barrier layer 4b, and an undoped GaAs spacer layer 4c. There are also shown an emitter electrode 8E, a collector electrode 8C, and a base electrode 9. One of the novel features of the present invention is that the quantum well structure 4 is selectively provided only under the base electrode 9 on the p-type GaAs base layer 3.

Such an RBT is fabricated as follows. Sequentially grown on (100) S.I. GaAs substrate 10 by, for example, molecular beam epitaxy (hereinafter abbreviated as "MBE") are:

n-type GaAs layer 1
(impurity concentration $3\times10^{18}/cm^3$) ... 1 μm,
n-type GaAs layer 2
(impurity concentration $1\times10^{17}/cm^3$) ... 250 nm,
p-type GaAs layer 3
(impurity concentration $5\times10^{18}/cm^3$) ... 200 nm,
Undoped GaAs layer 4c ... 5 nm,
Undoped AlAs layer 4b ... 2 nm,
Undoped GaAs layer 4a ... 2 nm,
Undoped AlAs layer 4b ... 2 nm,
Undoped GaAs layer 4c ... 5 nm, and
p-type GaAs layer 5
(impurity concentration $1\times10^{19}/cm^3$) ... 100 nm.

Then, after a part of the epitaxial layer is etched off to expose and clean the surface of the p-type base layer 3, n-type AlGaAs layer 6
(impurity concentration $5\times10^{17}/cm^3$) ... 100 nm, and
n-type GaAs layer 7
(impurity concentration $5\times10^{18}/cm^3$) ... 100 nm are selectively regrown on the surface of the p-type base layer 3 by, for example, the MBE growth process. Furthermore, the surface of the n-type sub-collector layer 1 is exposed by etching off a part of the epitaxial layers. Metals such as AuGe/Ni/Au is evaporated on the surfaces of the n-type contact layer 7 and the sub-collector layer 1 after which normal alloying treatment is performed to form the emitter electrode 8E and the collector electrode 8C. In addition, composite metals such as Ti/Pt/Au are evaporated on the p-type contact layer 5 to form the base electrode 9. Thus, the RBT as shown in FIG. 1 is produced.

Figure 2:
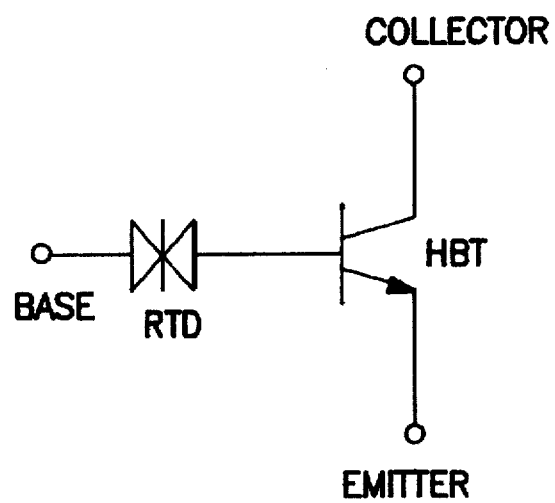
FIG. 2 is an equivalent circuit of the RBT according to the first embodiment of the present invention.

The laminated structure of the p-type contact layer 5, the quantum well structure 4, and the p-type base layer 3 functions as a resonant tunneling barrier to holes. On the other hand, the laminated structure of the n-type emitter layer 6, the p-type base layer 3, and the n-type collector layer 2 constitutes an NPN hetero-junction bipolar transistor (hereinafter abbreviated "HBT"). Accordingly, the RBT of this embodiment is considered to be equivalent with its NPN HBT to the base terminal connected to a hole resonant type resonant tunneling diode (hereinafter abbreviated "RTD") such as shown in the equivalent circuit of FIG. 2.

Figure 3:
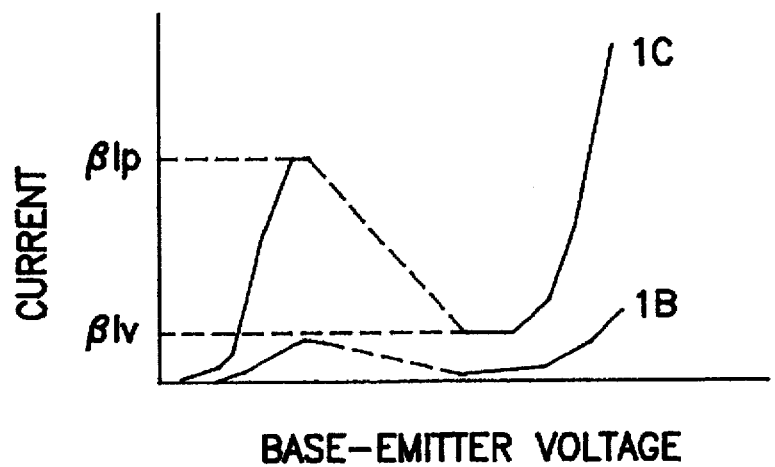
FIG. 3 is a current-voltage characteristics curve of the RBT according to the first embodiment of the present invention.

FIG. 3 shows the current-voltage characteristics of the RBT according to this embodiment. The base current $I_B$ exhibits negative differential resistance to the base-emitter voltage $V_{BE}$ because of the resonant tunneling effect of the holes, and, because, as described earlier, β is substantially constant independent of the current value, similarly good negative resistance characteristics are also obtained on the collector current $I_C$. That is, if the peak and valley currents for $I_B$ are assumed to be $I_p$ and $I_v$, respectively, the peak and valley currents for $I_C$ will be $BI_p$ and $BI_v$, respectively, whereby the peak to valley current ratio (P/V ratio) for $I_C$ will be substantially equal to that for $I_B$.

As described earlier, because the embodiment does not have a quantum well structure in the electron path, high emitter injection efficiency can be obtained thereby β being improved. In addition, in this embodiment the quantum barrier layer 4b to be as thin as 2 nm so as to suppress increase in the base resistance.

(Second Embodiment)

Figure 4:
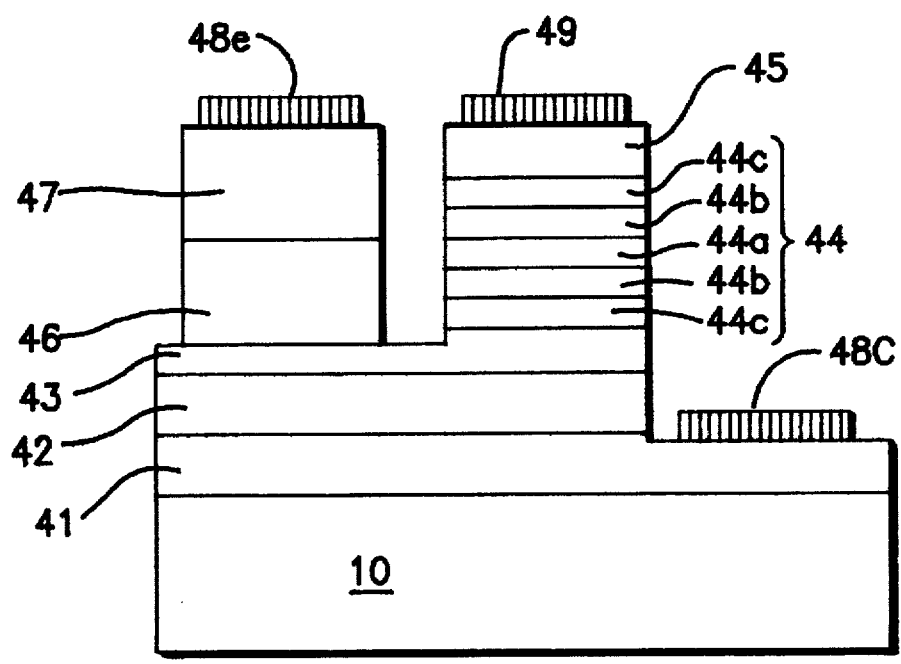
FIG. 4 is a schematic drawing showing the structure of the RBT according to a second embodiment of the present invention.
Figure 5:
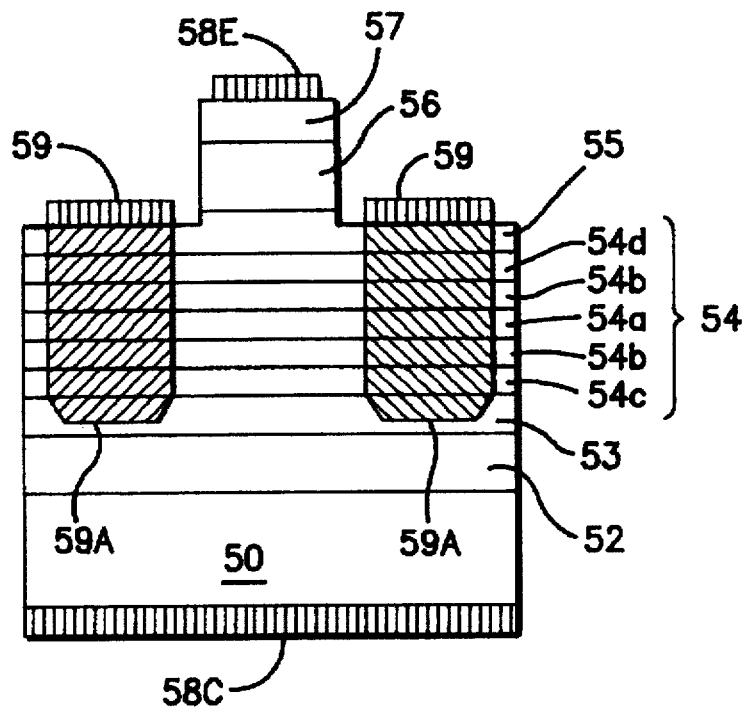
FIG. 5 is the structure of an RBT in the prior art.
Figure 6:
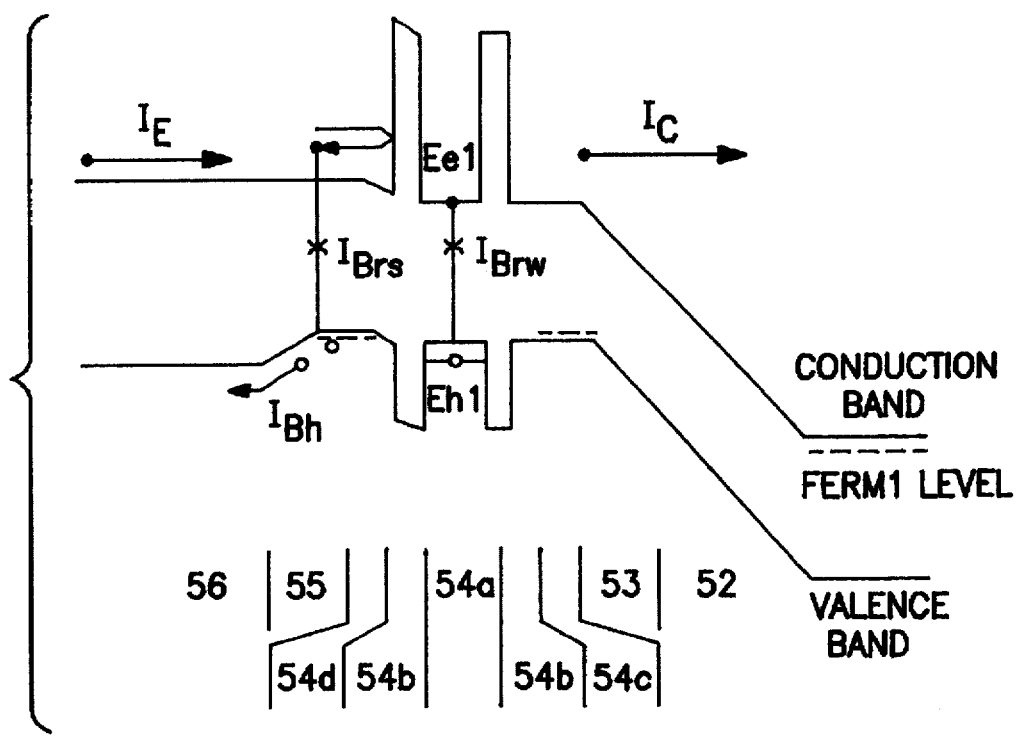
FIG. 6 is an energy-band diagram of the RBT in the prior art.

FIG. 4 shows the structure of the RBT according to the second embodiment of the present invention. In the figure, there are shown an S.I. GaAs substrate 10, a p-type GaAs layer 41 constituting a sub-collector layer, a p-type GaAs layer 42 constituting a collector layer, an n-type GaAs layer 43 constituting a base layer, a quantum well structure 44, an n-type GaAs layer 45 constituting a base contact layer, a p-type AlGaAs layer 46 constituting an emitter layer, and a p-type GaAs layer 47 constituting an emitter contact layer. In addition, the quantum well structure 44 is composed of a laminated structure consisting of an undoped GaAs spacer layer 44c, an undoped AlAs quantum barrier layer 44b, an undoped GaAs quantum well layer 44a, an undoped AlAs quantum barrier layer 44b, and an undoped GaAs spacer layer 44c. There are also shown an emitter electrode 48E, a collector electrode 48C, and a base electrode 49. One of the novel features of the present invention lies in that the quantum well structure 44 is selectively provided only under the base electrode 49 on the base layer 43.

Such RBT is fabricated as follows. Sequentially grown on (100) S.I. GaAs substrate 10 by, for example, MBE are:

p-type GaAs layer 41
(impurity concentration $3 \times 10^{19}$/cm$^3$) ... 1 μm,
p-type GaAs layer 42
(impurity concentration $1 \times 10^{17}$/cm$^3$) ... 250 nm,
n-type GaAs layer 43
(impurity concentration $5 \times 10^{18}$/cm$^3$) ... 200 nm,
Undoped GaAs layer 44c ... 5 nm,
Undoped AlAs layer 44b ... 2 nm,
Undoped GaAs layer 44a ... 5 nm,
Undoped AlAs layer 44b ... 2 nm,
Undoped GaAs layer 44c ... 5 nm, and
n-type GaAs layer 45
(impurity concentration $5 \times 10^{18}$/cm$^3$) ... 100 nm.

Then, after a part of the epitaxial layer is etched off to expose and clean the surface of the n-type base layer 43, p-type AlGaAs layer 46
(impurity concentration $5 \times 10^{17}$/cm$^3$) ... 100 nm, and
p-type GaAs layer 47
(impurity concentration $1 \times 10^{19}$/cm$^3$) ... 100 nm are selectively regrown on the surface of the n-type base layer 43 by, for example, the MBE growth process. Furthermore, the surface of the p-type sub-collector layer 41 is exposed by etching off a part of the epitaxial layers. Composite metals such as Ti/Pt/Au are evaporated on the surfaces of the p-type contact layer 47 and the sub-collector layer 41 to form the emitter electrode 48E and the collector electrode 48C. In addition, metals such as AuGe/Ni/Au are evaporated on the n-type contact layer 45 and alloyed to form the base electrode 49. Thus, the RBT as shown in FIG. 4 is produced.

The laminated structure of the n-type contact layer 45, the quantum well structure 44, and the n-type base layer 43 functions as a resonant tunneling barrier to electrons. On the other hand, the laminated structure of the p-type emitter layer 46, the n-type base layer 43, and the p-type collector layer 42 constitutes a PNP HBT. Accordingly, the RBT of the embodiment is considered to be equivalent with its PNP HBT to the base terminal connected to an electron resonant type RTD.

In this second embodiment, the base current $I_B$ exhibits negative differential resistance to the base-emitter voltage $V_{BE}$ because of the resonant tunneling effect of the electrons, and, because, as described earlier, β is substantially constant independent of the current value, similarly good negative resistance characteristics are also obtained on the collector current $I_C$.

As described earlier, because the embodiment does not have a quantum well structure in the hole path, high emitter injection efficiency can be obtained thereby increasing β. In addition, in this embodiment the quantum barrier layer 44b is desirably as thin as 2 nm to suppress increase in the base resistance.

In the above embodiments, while the present invention has been described by taking an AlGaAS/GaAs system RBT lattice matched to a GaAs substrate, the present invention can be applied to other material types such as an InGaP/GaAs system lattice matched to a GaAs substrate, an InAlAs/InGaAs or an InP/InGaAs system lattice matched to an InP substrate. In addition, while the present invention has been described by taking an RBT of a single-heterostructure as an example in which the base and collector layers are of the same material, the present invention can apply, of course, to an RBT of double-heterostructure in which the emitter and collector layers consist of materials different from that of the base layer. Furthermore, while the present invention has been described by taking an emitter-up RBT having the collector layer on the substrate as an example, it can apply, of course, to a collector-up RBT having the emitter layer on the substrate.

As clearly seen from the detailed description above, the present invention can attain good negative resistance characteristics by utilizing the resonant tunneling effect of the base majority carriers, and can eliminate a quantum well structure causing carrier accumulation from the path of carriers flowing between the emitter and the collector. Thus, it is possible to reduce the recombination current at the emitter-base interface and in the quantum well structure, thereby increasing current gain.

I claim:

1. A resonant tunneling bipolar transistor comprising:
    a semiconductor substrate;
    an n-type collector layer formed on said semiconductor substrate and a p-type base layer formed on said n-type collector layer;
    a laminated quantum well structure formed on a first part of said p-type base layer and a p-type contact layer formed on said laminated quantum well structure, wherein a quantum level of holes is generated in said quantum well structure;
    an n-type emitter layer formed directly on a second part of said p-type base layer; and
    a collector electrode, a base electrode and an emitter electrode forming ohmic contact with said n-type collector layer, said p-type contact layer, and said n-type emitter layer, respectively.

2. A resonant tunneling bipolar transistor comprising:
    a semiconductor substrate;
    a p-type collector layer formed on said semiconductor substrate and an n-type base layer formed on said p-type collector layer;
    a laminated quantum well structure formed on a first part of said n-type base layer and an n-type contact layer formed on said laminated quantum well structure, wherein a quantum level of electrons is generated in said quantum well structure;

a p-type emitter layer formed directly on a second part of said n-type base layer; and a collector electrode, a base electrode and an emitter electrode forming ohmic contact with said p-type collector layer, said n-type contact layer, and said p-type emitter layer, respectively.

3. A resonant tunneling bipolar transistor comprising:

a semiconductor substrate;

an n-type emitter layer formed on said semiconductor substrate and a p-type base layer formed on said n-type emitter layer;

a laminated quantum well structure formed on a first part of said p-type base layer and a p-type contact layer formed on said laminated quantum well structure, wherein a quantum level of holes is generated in said quantum well structure;

an n-type collector layer formed directly on a second part of said p-type base layer; and a collector electrode, a base electrode and an emitter electrode forming ohmic contact with said n-type collector layer, said p-type contact layer, and said n-type emitter layer, respectively.

4. A resonant tunneling bipolar transistor comprising:

a semiconductor substrate;

a p-type emitter layer formed on said semiconductor substrate and an n-type base layer formed on said p-type emitter layer;

a laminated quantum well structure formed on a first part of said n-type base layer and an n-type contact layer formed on said laminated quantum well structure, wherein a quantum level of electrons is generated in said quantum well structure;

a p-type collector layer formed directly on a second part of said n-type base layer; and a collector electrode, a base electrode and an emitter electrode forming ohmic contact with said p-type collector layer, said n-type contact layer, and said p-type emitter layer, respectively.

5. The resonant tunneling bipolar transistor as claimed in claim 1, wherein said quantum well structure comprises at least one undoped quantum barrier layer, at least one undoped quantum well layer and at least one undoped quantum barrier layer.

6. The resonant tunneling bipolar transistor as claimed in claim 2, wherein said quantum well structure comprises at least one undoped quantum barrier layer, at least one undoped quantum well layer and at least one undoped quantum barrier layer.

7. The resonant tunneling bipolar transistor as claimed in claim 3, wherein said quantum well structure comprises at least one undoped quantum barrier layer, at least one undoped quantum well layer and at least one undoped quantum barrier layer.

8. The resonant tunneling bipolar transistor as claimed in claim 4, wherein said quantum well structure comprises at least one undoped quantum barrier layer, at least one undoped quantum well layer and at least one undoped quantum barrier layer.

9. The resonant tunneling bipolar transistor as claimed in claim 1, wherein said n-type collector layer comprises a first n-type collector layer and a second n-type collector layer formed on said first n-type collector layer, said first n-type collector layer having an impurity concentration higher than said second n-type collector layer so as to form ohmic contact with said collector electrode, and said n-type emitter layer comprising a first n-type emitter layer and a second n-type emitter layer formed on said first n-type emitter layer, said second n-type emitter layer having an impurity concentration higher than said first n-type emitter layer so as to form ohmic contact with said emitter electrode.

10. The resonant tunneling bipolar transistor as claimed in claim 2, wherein said p-type collector layer comprises a first p-type collector layer and a second p-type collector layer formed on said first p-type collector layer, said first p-type collector layer having an impurity concentration higher than said second p-type collector layer so as to form ohmic contact with said collector electrode, and said p-type emitter layer comprising a first p-type emitter layer and a second p-type emitter layer formed on said first p-type emitter layer, said second p-type emitter layer having an impurity concentration higher than said first p-type emitter layer so as to form ohmic contact with said emitter electrode.

11. The resonant tunneling bipolar transistor as claimed in claim 3, wherein said n-type emitter layer comprises a first n-type emitter layer and a second n-type emitter layer formed on said first n-type emitter layer, said first n-type emitter layer having an impurity concentration higher than said second n-type emitter layer so as to form ohmic contact with said emitter electrode, and said n-type collector layer comprising a first n-type collector layer and a second n-type collector layer formed on said first n-type collector layer, said second n-type collector layer having an impurity concentration higher than said first n-type collector layer so as to form ohmic contact with said collector electrode.

12. The resonant tunneling bipolar transistor as claimed in claim 4, wherein said p-type emitter layer comprises a first p-type emitter layer and a second p-type emitter layer formed on said first p-type emitter layer, said first p-type emitter layer having an impurity concentration higher than said second p-type emitter layer so as to form ohmic contact with said emitter electrode, and said p-type collector layer comprising a first p-type collector layer and a second p-type collector layer formed on said first p-type collector layer, said second p-type collector layer having an impurity concentration higher than said first p-type collector layer so as to form ohmic contact with said collector electrode.

13. The transistor of claim 1, wherein an electrical current between said emitter layer and said collector layer does not flow through said laminated quantum well structure.

14. The transistor of claim 2, wherein an electrical current between said emitter layer and said collector layer does not flow through said laminated quantum well structure.

15. A resonant tunneling bipolar transistor comprising:

a base layer on a collector layer on a semiconductor substrate;

an emitter layer on said base layer; and a quantum well structure on said base layer for generating a quantum level of carriers, said quantum well structure being separated from said emitter layer so that an electrical current between said emitter layer and said collector layer does not flow through said quantum well structure.

16. A resonant tunneling bipolar transistor comprising:

a base layer on an emitter layer on a semiconductor substrate;

a collector layer on said base layer; and a quantum well structure on said base layer for generating a quantum level of carriers, said quantum well structure being separated from said collector layer so that an electrical current between said emitter layer and said collector layer does not flow through said quantum well structure.

* * * * *